US008729772B1

(12) United States Patent  (10) Patent No.: US 8,729,772 B1
Persson et al.  (45) Date of Patent: May 20, 2014

(54) SWEPT SIDEBAND PZT DRIVER CIRCUIT

(75) Inventors: Steve Persson, Simi Valley, CA (US);
David Arata, Moorpark, CA (US);
Frank Pedeflous, Oak Park, CA (US)

(73) Assignee: S&F Sonics, Simi Valley, CA (US)

( * ) Notice: Subject to any disclaimer, the term of this patent is extended or adjusted under 35 U.S.C. 154(b) by 306 days.

(21) Appl. No.: 13/341,834

(22) Filed: Dec. 30, 2011

Related U.S. Application Data

(60) Provisional application No. 61/428,835, filed on Dec. 30, 2010.

(51) Int. Cl.
*H01L 41/04* (2006.01)
(52) U.S. Cl.
USPC .......................................................... 310/317
(58) Field of Classification Search
USPC ................................................. 310/314, 317
See application file for complete search history.

(56) References Cited

U.S. PATENT DOCUMENTS

| 7,105,982 | B1* | 9/2006 | Hagood et al. | 310/319 |
| 8,076,825 | B1* | 12/2011 | Kaajakari | 310/339 |
| 2006/0028333 | A1* | 2/2006 | Tyndall | 340/447 |
| 2013/0307349 | A1* | 11/2013 | Hall et al. | 307/104 |

* cited by examiner

*Primary Examiner* — Derek Rosenau
(74) *Attorney, Agent, or Firm* — James F. Kirk

(57) ABSTRACT

A swept sideband driver circuit has a boost converter followed by a buck converter obtaining near unity power factor. A full wave bridge powered from the buck converter circuit drives the PZT output load. The output of the buck converter circuit is controlled by a power level control circuit. The analog power level control circuit receives a sample of the output load current and a sample of the output load voltage from which it produces a product. The product signal is compared with manually adjusted pot signal. A difference signal results and used to adjust the output voltage of the buck converter circuit thereby increasing or decreasing the power to the load to drive the error signal to zero. A swept sideband modulation circuit modulates the frequency of the full wave bridge with a harmonic rich signal thereby imposing side bands on the voltage to the PZT load.

16 Claims, 12 Drawing Sheets

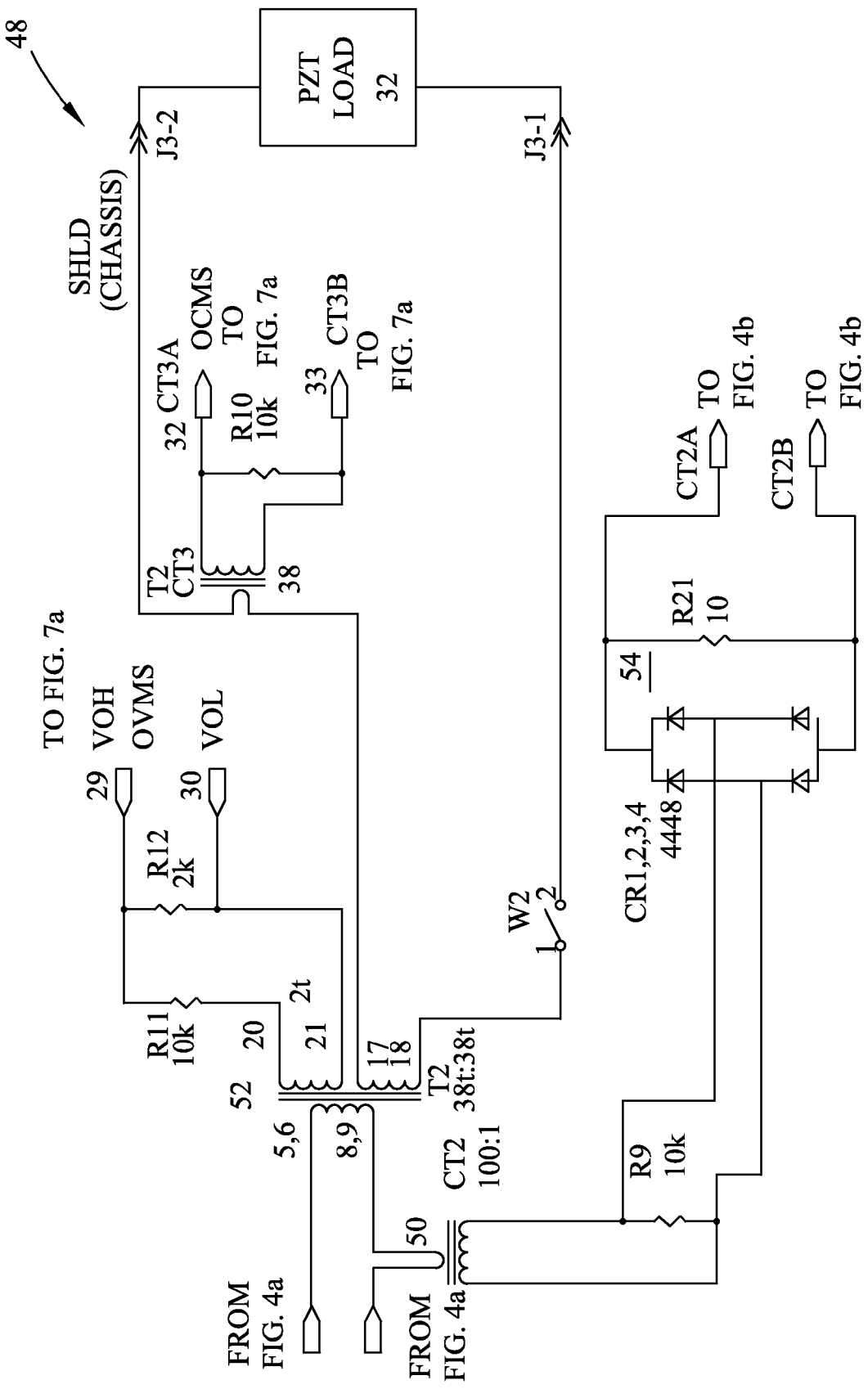
FIG. 5  POWER OUTPUT CIRCUIT AND LOAD

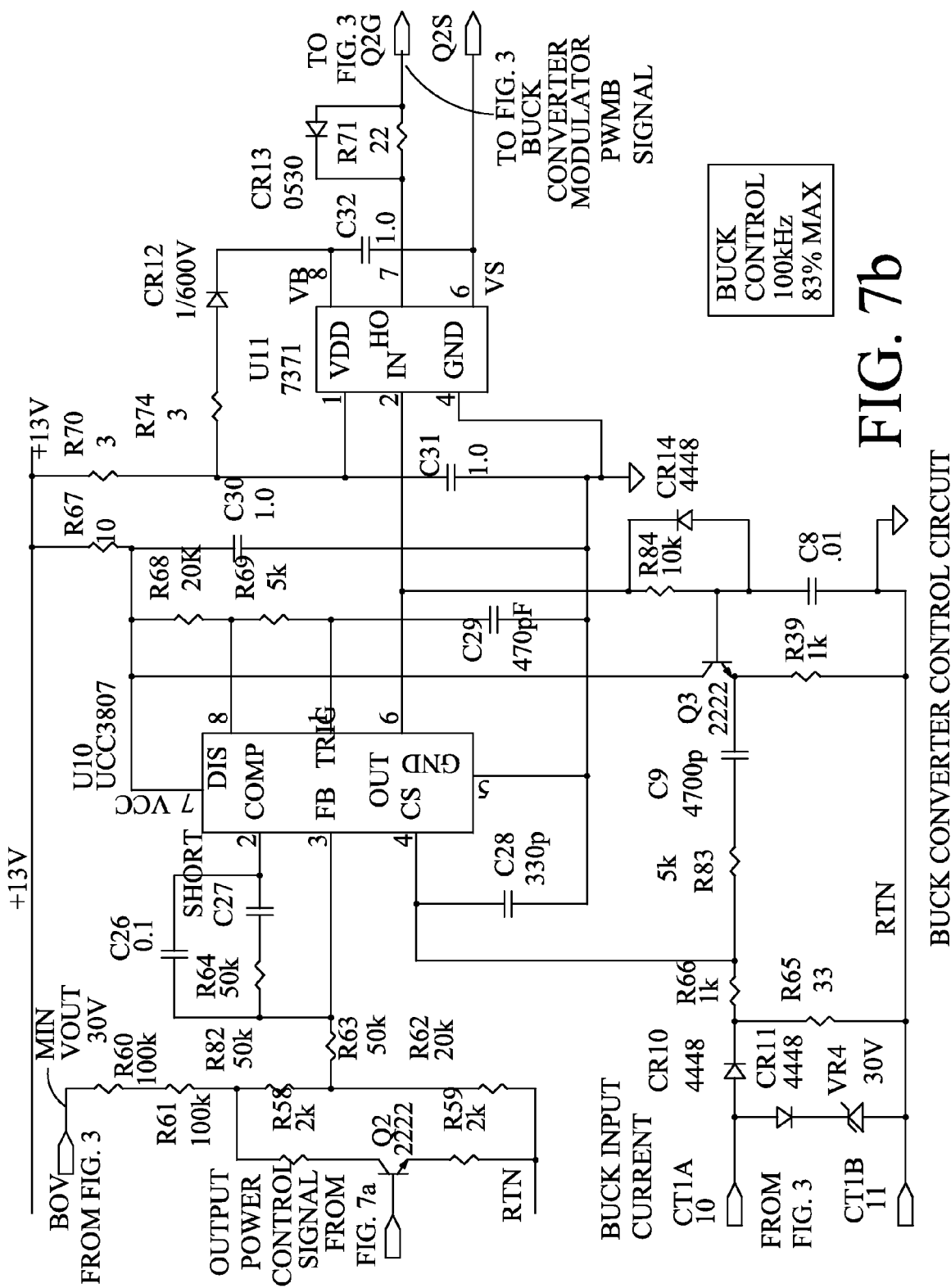
FIG. 7b BUCK CONVERTER CONTROL CIRCUIT

SWEPT SIDEBAND PZT DRIVER CIRCUIT

This invention claims priority from provisional patent application Ser. No. 61/428,835 filed Dec. 30, 2010 for a SWEPT SIDEBAND PZT DRIVER CIRCUIT having common inventors.

STATEMENT REGARDING FEDERALLY SPONSORED RESEARCH OR DEVELOPMENT

This invention was not developed with Government funded effort.

FIELD OF THE INVENTION

This invention relates to the field of driver circuits for non-linear and/or predominantly capacitive loads such as those encountered driving transducers PZT coupled to drive a mechanical load such as a basket charged with cleaning fluid and parts to be cleaned.

They are usable up to about 300° C. The first piezoceramic transducers used were made of barium titanate. In the 1960's transducers made of lead zirconate titanate compositions (PZT) became popular and are now the most commonly used ceramic for making PZT transducers. Materials including piezo-polymers and composites are also found in some applications.

The loads of interest here are high power loads requiring the delivery of several hundred watts of electrical power at frequencies as high as tens of kilohertz. Cleaning machines that clean parts for manufacturers are known to use PZT transducer(s) to drive cleaning baskets and as such, are likely to use driver circuits with which to drive the PZT transducer(s) coupled to their respective cleaning baskets.

BACKGROUND OF THE INVENTION

Previous PZT drive circuits for use in cleaning machines are believed to have selected center design frequencies such as 40 kHz and then modulated the center drive frequency at frequencies as high as +/−1.0 khz. The resulting output drive voltage to the PZT load was then also modulated as a result of rectification of the input line voltage that provided a ripple at 120 Hz. The resulting amplitude modulation was high approaching 100% and thereby requiring a higher peak resonant PZT drive voltage to obtain the same average power into the PZT transducer. The result was a lower overall efficiency and increased stress on all components of the system without an improvement in the cleaning result.

RELATED ART

U.S. Pat. No. 5,895,997 is related art, but the "997" reference fails to show a power factor correction circuit and provides only a single level of frequency modulation on a center drive frequency. The input is full wave rectified without a filter capacitor on the input. The output power is controlled by controlling the duty cycle setting of the PWM drive signal. At low output power settings, control drive frequency settings are less effective in transferring power to the load. When the duty cycle is low, such arrangements have difficulty in maintaining resonance. The result is a full wave rectified 120 Hz voltage at the input to the output bridge. The result is that the 997 reference provides an output drive voltage to the load that has a 120 Hz amplitude modulation. As the 120 Vac input is rectified, the input wave form falls to zero volts, 120 times a second. During these low voltage intervals, the output power to the load goes to a near zero level.

The disadvantage associated with such an arrangement is that a driver circuit of that type has to increase its peak output power to make up for the loss of output power during the reduction of voltage that periodically takes place at input zero voltage cross over intervals at a 120 Hz rate. To accommodate the ripple on the drive, the input voltage applied to the load is forced to operate at a higher level across the load. A circuit operating at a 450 watt output power level, absent the power correction factor portion of the circuit used by the invention circuit, would have to operate with an output voltage of 2500 volts at the PZT to obtain the same power that the invention circuit obtains with a 2000 volt output.

In addition, without the benefit of a power correction factor section that includes a boost modulator in addition to a buck converter modulator, a circuit of the type characterized in the 997 reference is forced to run at an amplitude modulation frequency of 120 Hz whereas this invention circuit can modulate the output drive voltage at any frequency desired over a wide range. This feature becomes possible because of the inclusion of a first function that can be set to run at frequencies other than that of the mains power input frequency, such as at frequencies ranging from 300 Hz up to 1.0 KHz if desired, and that are swept in amplitude at a 100 Hz rate.

BRIEF DESCRIPTION OF THE DRAWINGS

FIG. 5 is a schematic of the power output and load circuit with output transformer T2 and the PZT load section;

FIG. 7b is a schematic of the buck modulator PWMB drive signal section;

DESCRIPTION OF THE INVENTION

The invention Swept Sideband Driver Circuit will now be discussed with reference to FIG. 1 through FIG. 10 with FIG. 1 being a schematic functional block diagram of the invention swept sideband driver circuit 10. For the convenience of the reader, each of the blocks will reference a figure number where a detailed schematic of the respective circuitry is shown.

Figure 1:
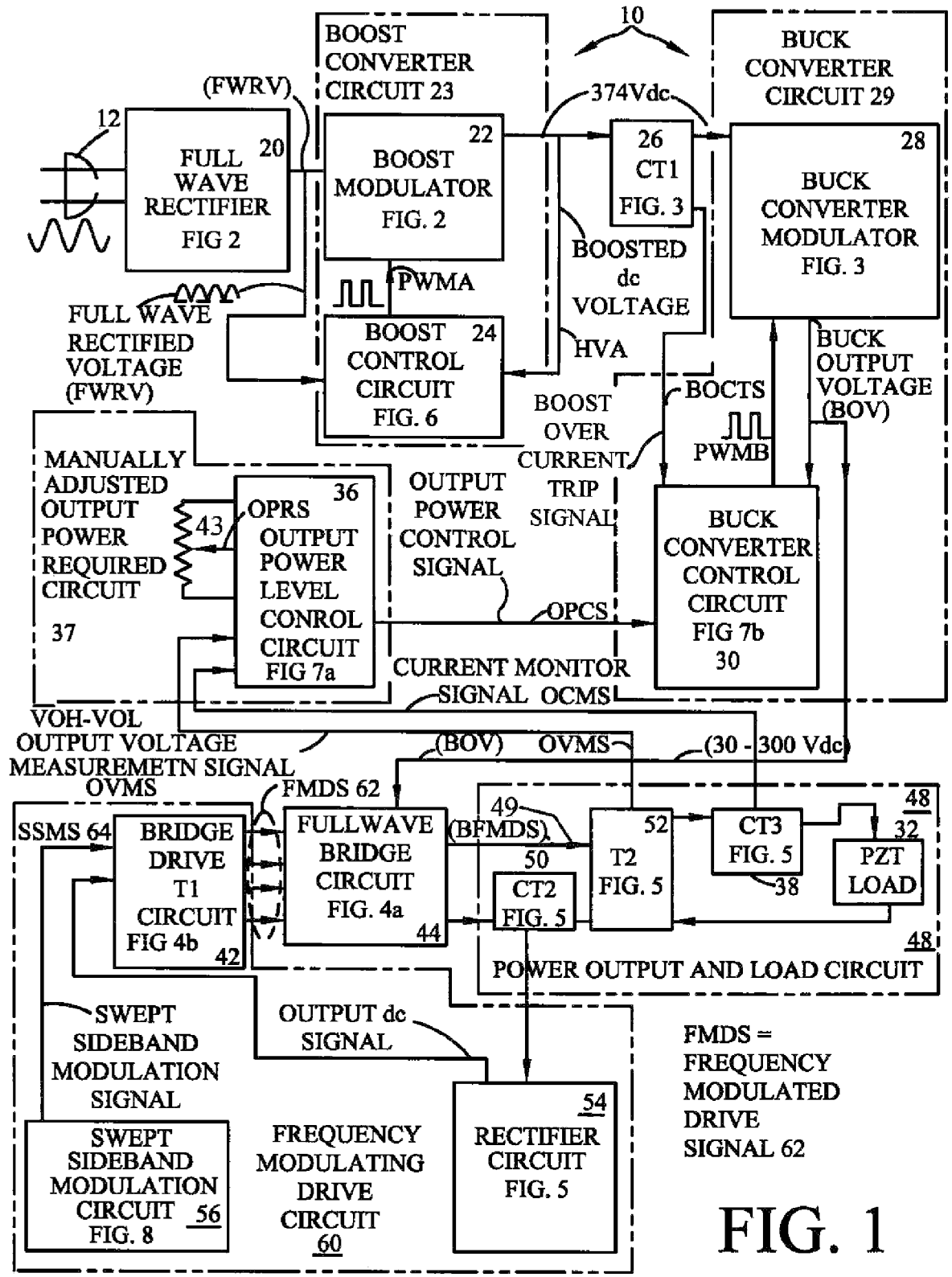
FIG. 1 Is a schematic block diagram of the Swept Sideband Driver Circuit.

Referring to FIG. 1, mains Vac power is applied to the circuit via input power plug 12. Block 20 represents a full wave rectifier that provides ac mains source, 120 Hz, 170 Vdc peak, full wave rectified voltage FWRV to a boost modulator represented by block 22, to provide power for the boost converter circuit 23. The boost converter is coupled to the full wave rectified voltage FWRV to provide a boosted dc voltage HVA, FIG. 1 shows buck converter circuit 29 coupled to receive the boosted dc voltage HVA for providing a buck output voltage BOV, the buck converter circuit being responsive to an output power control signal OPCS for adjusting the value of the buck output voltage BOV, Phantom block 23 represents a boost converter circuit that comprises the boost modulator 22 and the boost control circuit within block 24. The boost modulator 22 is coupled to the full wave rectified input dc voltage FWRV and to a first pulse width modulated signal PWMA from the boost control circuit represented by block 24. The boost modulator 22 operates to provide the boosted dc voltage HVA of approximately 374 Vdc to the buck converter modulator represented by block 28.

FIG. 1 shows that the boost control circuit 24 receives a sample of the 120 Vdc rectified voltage titled FWRV from the output of the full wave rectifier and a second sample voltage from the 374 Vdc output of the boost modulator 22, HVA bus. The boost modulator 22, has a resistor in the return path for the boosted dc voltage that provides a switch mode current sense voltage IS. The boost modulator circuit 22 is coupled to be powered from the full wave rectified voltage FWRV and is coupled to be driven and regulated by the boost pulse width modulated signal PWMA from the boost control circuit 24 to provide the boosted dc voltage HVA output voltage and the switch mode current sense voltage IS. The boost control circuit 24 is coupled to sample the full wave rectified input dc voltage FWRV, the switch mode current sense voltage IS for power factor correction and control, and the boosted dc voltage HVA for feedback to constantly adjust the duty cycle of the boost pulse width modulated signal PWMA, to maximize the power factor correction of the boost converter circuit, and to hold the value of the boosted dc voltage HVA within a predetermined boosted dc voltage range.

Figure 2:
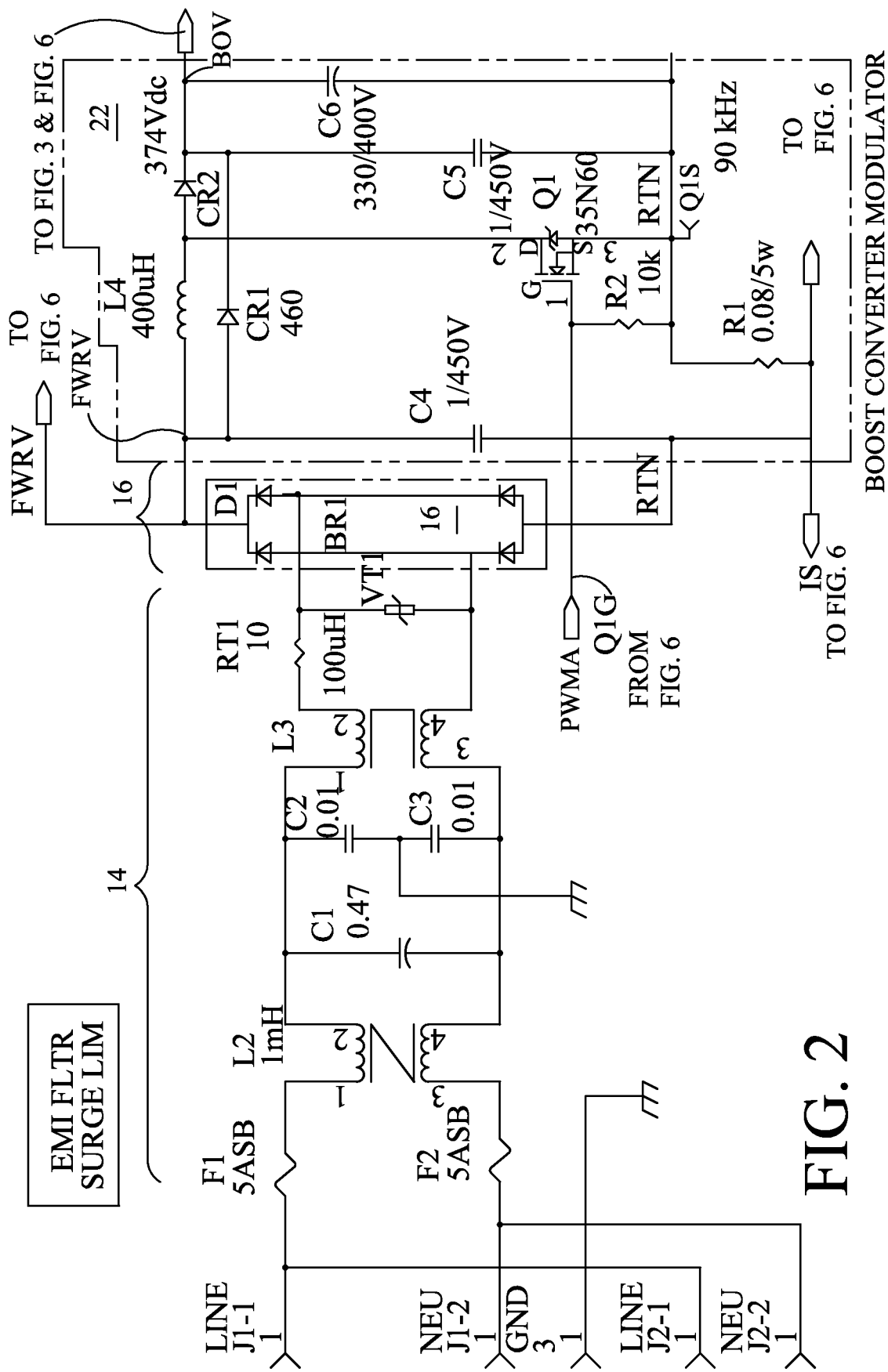
FIG. 2 is a schematic of the input power section and the boost modulator section.

FIG. 2 shows the current sense resistor R1 connected in series with the return circuit from the boosted dc voltage. The return current through the current sense resistor, signal IS, provides a current mode control feedback signal that is compared to a current command signal within a boost control circuit (not shown) within U2 on FIG. 6 for power factor control by controlling the duty cycle of the boost modulator switch, shown on FIG. 2 as FET Q1. The pulse width modulated drive signal PWMA is provided to drive the gate of the boost modulator switch FET Q1.

Block 24 represents the boost control circuit coupled to sample the full wave rectified voltage FWRV, and the boosted dc voltage HVA and to constantly adjust the duty cycle of the first pulse width modulated signal PWMA, to maximize the power factor correction of the boost converter circuit. The boost circuit operates as a pre-regulator that provides a 374 Vdc source of power to the buck converter circuit represented by phantom block 29 in FIG. 1 and more particularly to the buck converter modulator represented by block 28. Block 26 represents a current transformer CT1 that provides an output current signal that provides a measure of the output current from the boost modulator 22 to the buck converter module 28. The signal from the CT1 transformer is shown on FIG. 1 coupled to the buck converter control circuit represented by block 30. The CT1 output signal is labeled over current trip. The buck converter control circuit 30 is designed to interrupt the PWMB drive to the buck converter modulator 28 terminating its operation in response to the over current trip signal from CT1 exceeding a predetermined trip limit.

The buck converter modulator 28 and the buck converter control circuit represented by block 30, in combination comprise a buck converter circuit represented by phantom block 29. The buck converter modulator 28 down-converts power from the 374 Vdc buss to a buck output buss voltage, a controlled dc voltage level in the range of from 90 Vdc down to 30 Vdc in response to an input shown as the output power control signal from block 36 representing an analog power control circuit.

The output power control signal POCS from block 36 to Block 30 on FIG. 1 controls the value of the buck output buss voltage BOV to adjust the output power delivered to a load such as the PZT load represented by block 32. The buck converter control circuit 30 of FIG. 7b receives a sample of the buck output voltage, BOV for comparison with the output power control signal for the delivery of a PWMB signal to the buck converter modulator 28 and an input current measurement signal from CT1 for over current protection.

Referring to FIG. 1 and FIG. 5, Block 36 represents an output power level control circuit. Phantom block 37 represents a manually adjusted output power required control circuit with adjustable resistor 43. One skilled in the art will understand that the output power required signal OPRS at the wiper of resistor 43 could be a dc signal provided from a DAC controlled from a remote digital computer or other like control system as well as from a manual pot. Variable output power control resistor 37 is manually adjusted to provide an output power level signal to characterize the power level control circuit 36 to set the output power level of the swept sideband driver circuit 10 to the PZT driving the mechanical load at the desired level. Resistor R43 is a manually adjusted pot that defines the output power required to the PZT and the resistor is shown on FIG. 7a. The output power required signal OPRS on the third terminal of the resistor taps off the signal voltage scaled to define the power level required at the PZT load, The power level control circuit 36 also receives an output current measurement signal OCMS, a signal providing a measurement of the current through the PZT load. The OCMS signal is provided by the current sense transformer CT3 38, signal that represents the current through the PZT load 32. The power level control circuit 36 also receives an output voltage measurement signal OVMS from an output winding on T2, block 52 within the power output and load circuit shown within phantom block 48. CT3 38 and the terminating resistor R10 on FIG. 5 therefore represents a means for providing an output current measurement signal OCMS proportional to the current passing through the PZT load. The T2 transformer winding T2-20 to T2-21 as shown on FIG. 5, when terminated by the scaling resistors such as R11 and R12 tap off an output voltage measurement signal OVMS proportional to the voltage applied to the PZT load. The T2-20 to T21 winding and associated circuit on FIG. 5 thereby provides a means for providing a measurement signal OVMS proportional to the voltage applied to the PZT. Output transformer 52 has a primary winding driven by the buffered frequency modulated output drive signal BFMDS from the full wave bridge 44, and a first secondary for coupling output voltage to the PZT load.

The load voltage signal is scaled to represent the voltage applied to the PZT load 32. The POWER LEVEL CONTROL CIRCUIT 36 performs an analog multiplication of the load current signal CT3 and the load voltage signal to obtain an OUTPUT POWER CONTROL SIGNAL representing the power that is being applied to the PZT load 32. The POWER LEVEL CONTROL CIRCUIT 36 compares the OUTPUT POWER CONTROL SIGNAL resulting from the multiplication with a bias or command signal from the OUTPUT POWER CONTROL RESISTOR 37 to increase or decrease the output power control signal to block 30 as required to manually control the power to the PZT load 32.

Block 42 represents a bridge drive circuit that provides four fixed duty cycle drive signals to block 44 at a nominal drive frequency of 40 khz. Block 44 represents a full wave bridge circuit with four switches in an "H" arrangement. The full wave bridge circuit 44 is powered from the buck output buss voltage from the buck converter modulator 28. The voltage applied to the rail of the full wave bridge circuit 44 to directly control the power applied to the PZT load 32.

Phantom block 48 represents a power output and load circuit function.

The power output and load circuit 48 is powered by the buffered frequency modulated output drive signal BFMDS 49 from the output of the full wave bridge circuit 44, for providing a drive signal to the PZT load 32.

Current transformer CT2 50 samples the load current from output transformer T2 52. The sample current signal from the input of T2 is coupled to a the CT2 rectifier circuit 54 where it is converted to a dc bias signal that represents the amplitude of the current being delivered to the primary of T2 52. The output winding of transformer T2 52 drives the PZT load 32 via the primary of CT3 38.

Block 56 represents a swept sideband modulation circuit 56 that comprises a nominal first function generator operating as a first oscillator at a 1.0 KHz and a second function generator operating as a second oscillator operating at 100 Hz. The second function generator modulates the frequency set point of the first function generator sweeping the frequency of the first function generator over a range of frequencies to provide a SWEPT SIDEBAND MODULATION SIGNAL that varies in frequency from a low of 900 Hz to a high of 1100 Hz at a 100 Hz rate. The swept sideband modulation signal of the first function generator is then fed to block 42 where it modulates the operating frequency of the bridge drive circuit 42 from a nominal 40 KHz set point above and below the set point in a blend of frequencies centered at 40 KHz and ranging from 38900 Hz up to 41100 Hz. A first purpose of the composite or dither frequency is to break up and disturb any standing waves that might be developed. A second purpose is to spread the energy delivered to the PZT load on FIG. 5 over a broad spectrum so as to avoid high peak energy deliverance within narrow spectrums that might more quickly age or degrade or damage sensitive parts.

As shown in FIG. 2, input main power is typical 120 Vac, 60 Hz voltage at appliance input plug 12. The input voltage passes through a line filter and transient suppressor component group under bracket 14. The resulting 60 Hz voltage is applied to a full wave rectifier D1 under bracket 16. The full-wave rectifier comprises four diodes in a conventional encapsulated bridge arrangement. Rectification of the 110-120 mains ac voltage provides a 120 Hz, voltage source having a full wave dc peak amplitude of approximately 170 Vdc. The 170 Vdc full wave dc voltage is unfiltered except for a 1.0 uF, 450V capacitor. The 170 Vdc is fed to the input of the boost modulator circuit within phantom block 22.

Figure 6:
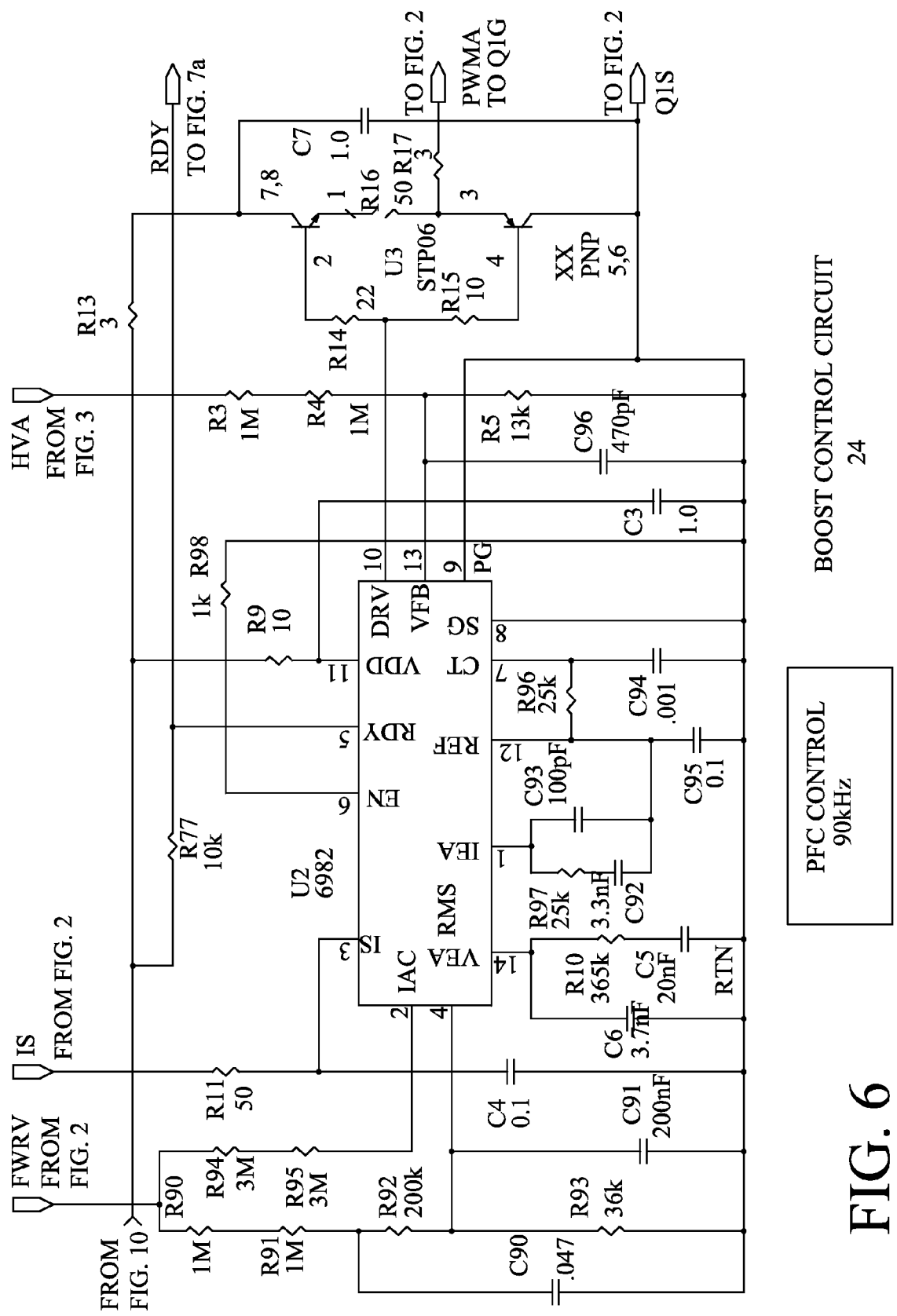
FIG. 6 is a schematic of the boost control section.

FIG. 2 shows the boost modulator circuit within phantom block 22. The circuit topology comprises L4, boost modulator switch Q1 and output diode CR2. The boost control circuit 24 is shown in FIG. 6. The boost control circuit provides a pulse width modulated drive signal to the gate of FET Q1 on FIG. 2. As the drive signal turns on, input current ramps up in L4 for the duration of the ON period. At the end of the ON interval, inductor L4 raises the voltage on the drain of Q1 to the point at which CR2 clamps the rise at one forward biased diode drop above the voltage on capacitors C5 in parallel with C6. During the following OFF interval, the inductor delivers the ½ L*I² energy into capacitors C5 and C6. The boost circuit modulator typically operates at a frequency of 90 kHz. As shown on FIG. 6, the boost control circuit 24 uses U2, a 6982 special purpose power factor correction and control IC from a supplier such as Fairchild, to provide drive signal to the gate of Q1 that results in the boost stepped up buss voltage of 374 Vdc to the input of the buck converter circuit within phantom block 29 and more particularly to the input to the buck converter modulator 28.

Figure 3:
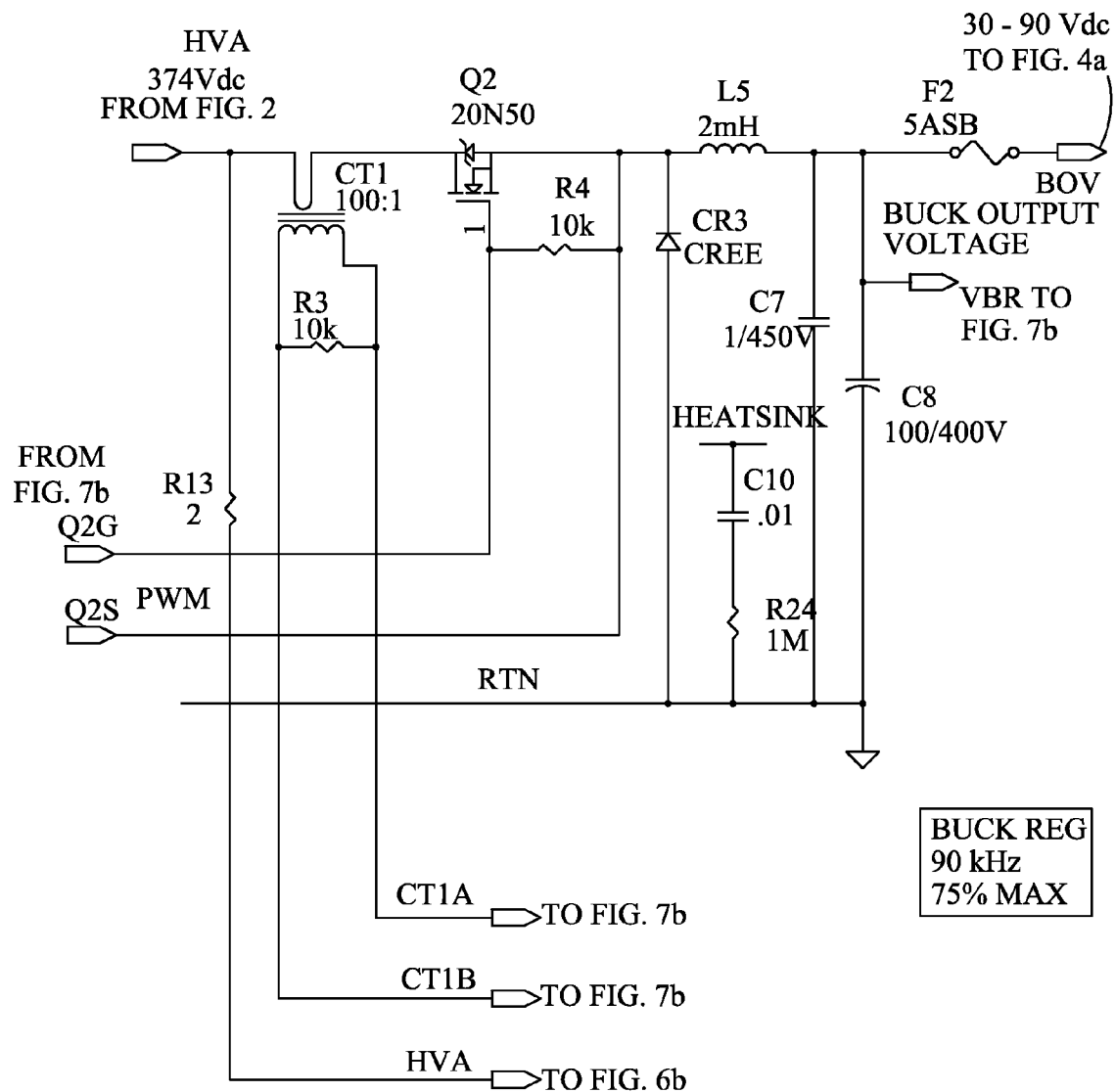
FIG. 3 is a schematic of the buck modulator driver circuit.
Figure 7A:
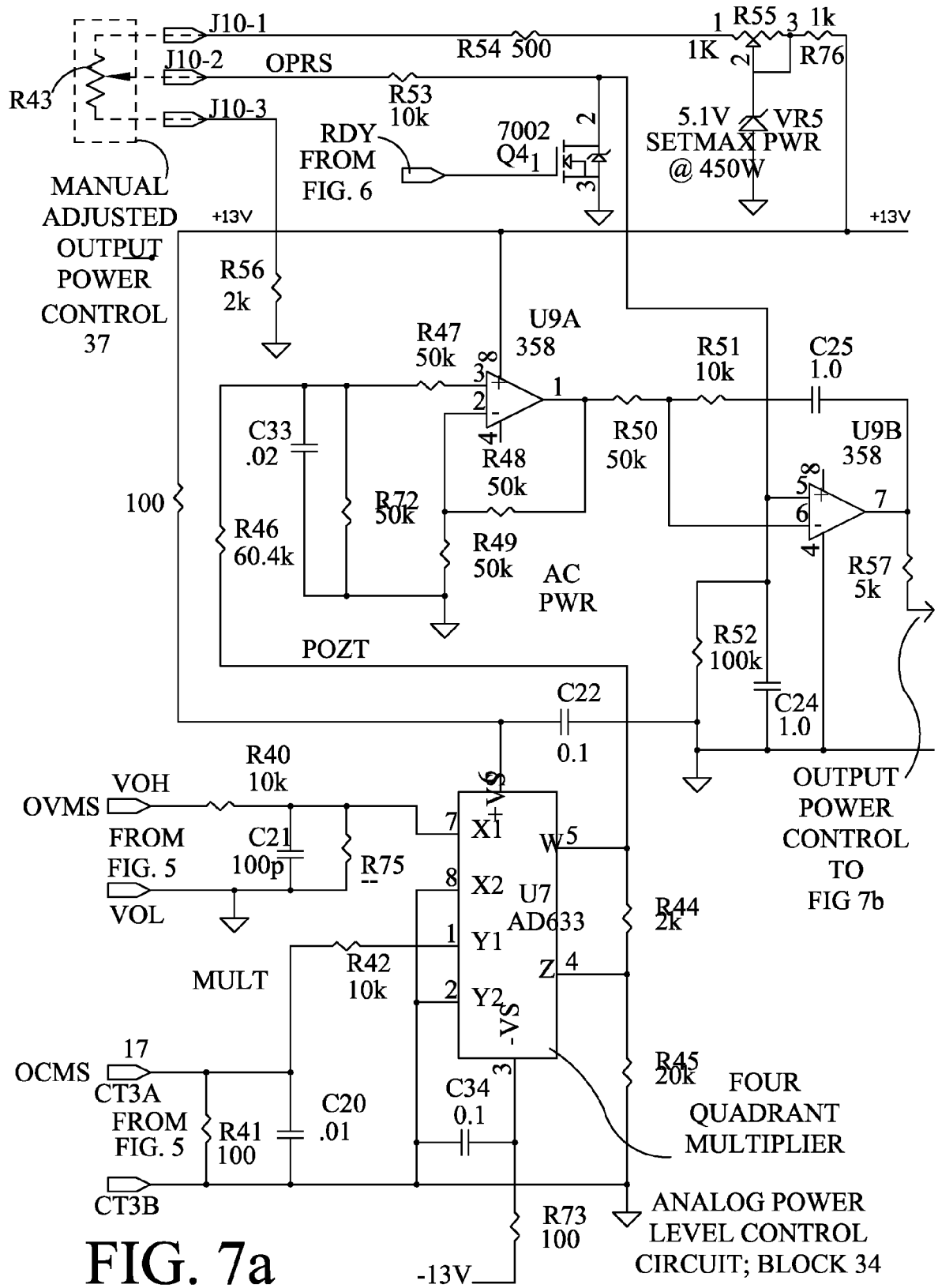
FIG. 7a is a schematic of the output power control signal section.

The buck converter circuit within phantom block 29 on FIG. 1 comprises a buck converter modulator 28 shown in detail on FIG. 3 as well as the buck converter control circuit shown on FIG. 7*b*. The output voltage of the buck converter circuit of phantom block 29 is controlled by the combined operation of the output power level control circuit within phantom block 37 and shown more particularly on FIG. 7*a* and the buck converter control circuit 30 shown more particularly on FIG. 7*b*.

The buck converter control circuit 30 provides a pulse width modulated PWMB drive signal to the gate of FET Q2 shown on the buck converter modulator 28 schematic on FIG. 3. As shown on FIG. 3, the buck converter modulator comprises FET Q2, L5 and C7, a 1.0 uF 450 V capacitor in parallel with C8, a 100 uF, 450 V capacitor. As output power to the PZT load is increased, the duty cycle of the ON time of the PWMB signal from the buck converter control circuit 30 is increased in response to an increase in the output power control signal from the power level control circuit 36 to the buck converter control circuit 30. The power level control circuit 36 receives an output load current monitor signal that characterizes the current passing through the output load, PZT 32. The power level control circuit 36 also receives a an output voltage measurement signal OVMS load voltage signal from transformer T2 52.

The power level control circuit 36 contains an analog multiplier function that produces a product signal that characterizes and tracks the output power delivered to the PZT 32 as the analog product of the output load current monitor signal OCMS and the output voltage monitor signal OVMS load voltage signal inputs. The circuits internal to the power level control circuit 36 compares the product value with a scaled manual output signal from variable resistor 37 and adjusts its power output control signal, POCS to the buck converter control circuit 36 to adjust the output power to the PZT 32 in a direction to drive difference between the commanded value from the manual output control 37 and the value resulting from the product of the output current monitor signal OCMS and the output voltage measurement signal OVMS signal to zero. The variable resistor 37 has a first terminal connected to a bias voltage source, a second terminal connected to a reference return level and a control terminal coupled to a manually positioned tap of the resistor for sensing a manually selected signal voltage scaled to represent the output power required signal OPRS.

It should be understood that the control function of the power level control circuit could be performed by a functionally equivalent digital circuit as a design choice with corresponding software.

The output power control to the PZT will be described in more detail with reference to the schematics of FIG. 7*a* and FIG. 7*b*. In the circuit description to follow, it will be seen that the combination of the pre-regulator boost circuit and the post regulator buck regulator, in combination permit control of the buck output voltage BOV or rail voltage to the full wave bridge 44 of FIG. 4 from values down to near zero up to values near the 374 Vdc virtually independent of variations in the 120 Vac line voltage or ripple on the output of the input rectifier D1.

In the present embodiment, the output load is a PZT that vibrates a basket loaded with cleaning solvent and parts. The PZT 32 provides an electrical load on the output of approximately 450 watts as it mechanically drives a basket loaded with cleaning fluid and parts to be cleaned (not shown). In providing that power, it is estimated that the current demand from the 374 Vdc bus is about 1.2 amps average. FIG. 2 shows that the boost modulator in the preferred embodiment operates at a switching frequency of approximately 90 KHz and is filtered by a capacitive filter that reduces the 374 Vdc buss ripple to be less than 5 percent by operation of the boost control circuit 24 on FIG. 6 and at a ripple frequency of 120 Hz due to the 120 Hz full wave rectified input voltage source from the full wave rectifier 20.

The boost control circuit 24, in the power factor correction and boost converter circuit 23, operates to bring the input power factor of the swept side band driver circuit 10 under full load to near unity thereby increasing the overall efficiency of the invention driver circuit. The boost control circuit 24 is shown in the schematic on FIG. 6. The boost control circuit 24 is provided with a sense voltage FWRV that in FIG. 1 is sensed at the output of the full wave rectifier 20 and is shown on FIG. 2 as D1. Referring to FIG. 6, Integrated circuit U2 is a 6982 factor correction IC designed for use with power factor correction pre-regulator circuits.

In addition to the sense voltage FWRV, the boost control circuit 24 of FIG. 6 also receives IS, a current sense voltage that is developed across a current sense resistor R1 shown on FIG. 2 in the return path to the full wave rectifier D1. The boost control circuit 24 of FIG. 6 also receives the 374 VDC buss signal HVA from capacitor C5 on FIG. 2. The 374 VDC buss signal HVA is scaled and used as a feedback voltage to the feedback input pin 13 of U2 on FIG. 6 to control the output level of the boost converter circuit 23. The boost control circuit 24 is responsive to the sensed FWRV signal to increase the duty cycle of the boost converter circuit 23 as the 120 Hz rectified mains voltage passes each peak value and drops toward zero volts by modulating the duty cycle of the boost modulator switch, FET Q1.

Boost Converter Circuit

FIG. 6 shows that the boost control circuit uses a Fairchild 6982 Power Factor Correction IC. As stated in Fairchild Application Note AN6982 of 2010, the "FAN6982 is a continuous conduction mode CCM power factor correction PFC controller IC that employs a leading-edge modulation for average current control and has a number of advanced features for better performance and reliability. The variable output voltage function (a range function) reduces PFC output voltage at light load and low-line conditions to improve light-load efficiency, but can also be easily disabled using the EN (enable) pin. The RDY signal pin 5 could be used for the power-on sequence of a down-stream dc-to-dc converter, but in the present embodiment, it is not used. The 6982 provides "tri-fault detect function helps reduce external components and provides full protection for feedback loops such as open, short and over voltage. The FAN6982 also includes PFC soft-start, peak current limiting, line feed-forward and input voltage brownout protection".

The duty cycle of the boost switch Q1 in the boost modulator circuit 22, and shown on FIG. 2, is interrupted in the event of an unexpected rise in the current sense voltage IS across sense resistor R1, also shown on FIG. 2 that exceeds the predetermined trip limit. The current sense voltage IS, is scaled and fed to pin 3, the IAC pin of regulator circuit U2 on FIG. 6 for immediate control of the PWMA drive to the gate of Q1.

Buck Converter Modulator Circuit

FIG. 3 is a schematic that shows the buck converter modulator circuit 28 in the buck converter circuit function within phantom block 29. The buck converter modulator circuit 28 comprises modulator switch Q2, L5, CR3 and C7 in parallel with C8 driven by the 374 Vdc boost voltage through the primary of current sense transformer CT1, shown on both FIG. 1 and FIG. 3. The buck converter circuit 29 provides the rail voltage BOV that drives a full wave bridge shown on FIG. 4a that comprises FETs Q3, Q4, Q5 and Q6. The filtered output of the buck converter circuit 29 is limited to the ac range of 0-300 V peak above ground. The combination of the boost converter circuit 23 operating as a pre-regulator followed by the buck converter circuit 29 present a near resistive load and therefore a near unity power factor to the input electrical service. 14. The full wave bridge circuit 44 is further characterized as being coupled to the frequency modulated drive signal FMDS 62 and to the buck output voltage BOV to provide a buffered frequency modulated output drive signal BFMDS 49.

A near unity power factor provides a saving in the cost of operating the circuit that is not enjoyed by PZT driver circuits that do not employ a power factor correction and boost circuit 21 (a pre-regulator and a buck converter circuit 29 (a post regulator) input power management arrangement such as characterized and taught herein for this invention swept sideband driver circuit 10. In addition to the near unity power factor, the combination of the boost converter circuit 23 and buck converter circuit 29 also allows the invention driver circuit to continue to operate normally as the input electrical service voltage varies from a low of 90 volts Vac to a high of 256 Vac.

In an alternative arrangement, it can be seen that the input bus could be easily adapted to operate off a dc voltage derived from a battery stack since the input power is immediately converted to a dc buss voltage before further processing.

The boost control circuit 24 aids in supporting the 374 Vdc bus to the buck converter circuit 29 by increasing the duty cycle of the boost modulator 22 as the full wave rectified input dc voltage output of full wave rectifier 20 D1 drops from a peak swing of almost 170 volts to a near zero value with each half cycle of the input voltage and then begins a rise to its next peak value at a 120 Hz rate. The buck converter circuit 29 draws power off of the 374 Vdc bus and down-converts the boosted dc voltage HVA to the controlled rail voltage to the full wave bridge circuit 44 shown on FIG. 4a. The full wave bridge circuit 44 of FIG. 4a uses the applied 300 V swing on its rails to provide a balanced square wave drive to the primary winding of transformer T2, 52 shown on FIG. 5 with a typical peak to peak swing of 600 volts at an output frequency of 35-45 KHz across the primary of T2 52 as shown in FIG. 5.

Buck Converter Control Circuit FIG. 7b

Figure 4A:
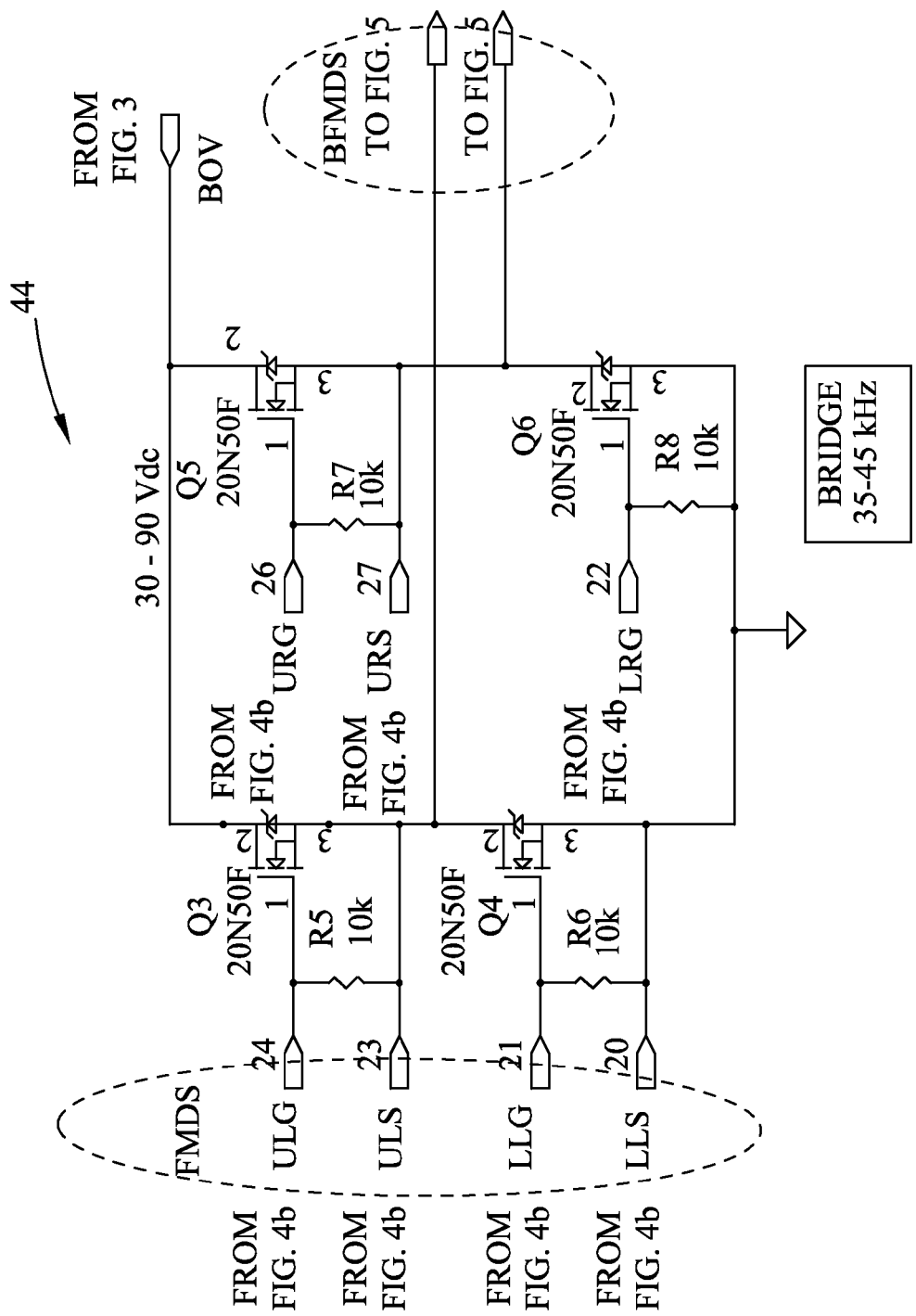
FIG. 4a is a schematic of the full-wave bridge circuit.

FIG. 7b shows the buck converter control circuit 30 that controls the PWMB drive to the buck converter modulator 28 of FIG. 3 and thereby controls the buck output voltage BOV, (the rail voltage) to the full wave bridge of FIG. 4a, and thereby controls the output power to the PZT load. In the circuit description to follow, it will be seen that the combination of the boost converter circuit 23 and the buck converter circuit 29, in combination, permit control of the buck output voltage BOV, (the rail voltage) to the full wave bridge of FIG. 4a from values down to near zero up to values near the 374 Vdc, boosted dc voltage HVA, virtually independent of variations in the 120 Vac line voltage or ripple on the output of the input rectifier D1 20.

The circuit of FIG. 7b shows the use of the UCC3807 IC, originally a component sourced from Unitrode, but that is now available from Texas Instrument under the same part number. As background, the UCC3807 contains all of the control and drive circuitry required for off-line and DC-to-DC fixed frequency current mode switching power supplies with minimal external parts count. The UCC3807 IC has a user programmable maximum duty cycle. The oscillator frequency and maximum duty cycle are programmed with two resistors and a capacitor. The UCC3807 has a full cycle soft start and internal leading edge blanking of the current sense input.

FIG. 7b shows a CT1A and CT1B current input to the CS, current sense, input of U10 at pin 4. The primary winding of the CT1 current transformer shown on FIG. 3 is in the path of all current entering the buck converter modulator 28. The secondary coupled to CT1A and CT1B is terminated to provide and over-current trip signal to pin 4 of U10 on FIG. 7b that enables the U10 Controller to interrupt and instantly reduce the duty cycle of the drive signals from the U11 PNP Darlington Driver IC, also on FIG. 11, to the buck converter modulator 28 as shown on FIG. 3, to FET Q2 via the Q2G and Q2S, the gate and source of Q2. The CT1 transformer is therefore an over-current protection current sense transformer that can interrupt the output voltage of the buck converter modulator 28 as voltage HVB to the full wave bridge circuit shown on FIG. 4a.

The HVA signal from the boost modulator circuit on FIG. 3 is coupled to FIG. 7b to bias the series resistor string formed by R60, R61, R82 and R62 to provide a control voltage via R63 to pin 3 of U10. U10 provides PWMB, a pulse width modulated drive signal as a controller that provides a 90 KHz duty cycle drive signal via U11 to the buck regulator driven by FET Q2 in the upper right quadrant of FIG. 3 to control the rail voltage to the full wave bridge on FIG. 4a thereby regulating the output drive to the PZT.

The HVB signal from FIG. 3 has a lower limit of 30 volts when the output of the buck regulator is commanded low. As the value of the HVA voltage from the boost modulator 22 increases, the bias into pin 3 of U10, the FB input, increases and as the bias level exceeds a predetermined control limit, U10 responds by reducing the duty cycle of the Q2G signal to the gate of Q2 on FIG. 3, the FET switch modulator for the buck regulator on FIG. 3 thereby stopping a further rise in the output voltage of the buck regulator.

In commercial service, the only controls on the unit on the control panel are the on-off switch and the manual output power control shown on FIG. 1 as phantom block 37 and the manual output power control pot R43 on FIG. 7a. To operate the unit, the operator turns on the power switch and then adjusts the manual output power control pot R43 to obtain the power required out of the system to the PZT load 32 in the power output and load circuit phantom block 48 shown on FIG. 1. Referring to FIG. 7a, R43 is biased off of the +13 Vdc regulated source. As the manual output power control pot R43 is adjusted, the control voltage into the U9B-5 is adjusted to provide an operator controlled bias level into the non-inverting input pin of the U9B operational amplifier. The inverting input to the U9B operational amplifier, pin 6 receives the output of U9A-2. U9A is therefore a summing circuit that provides the difference between the output power required signal OPRS and the instantaneous power being dissipated in the PZT POZT and outputs the difference as an error signal on U9A-1.

The output of U9A-1 is therefore, POZT, a signal that is proportional to the output power that is being delivered to the load. The feed back elements R51 and C25 from U9B-7 to U9B-6 provide an integration function for frequencies substantially below the break frequency of the 10K R51 and the 1.0 uF values (i.e. 1 millisecond) of the capacitor C25. The U9B IC therefore provides an integrator circuit for scaling integrating, and buffering the error signal to provide the power control signal OPCS to the buck converter circuit 29 to control the value of the buck output voltage BOV, to drive the error voltage to zero.

The output signal from U9B-7 is the output power control signal OPCS to FIG. 7b, a difference signal between the operator demanded output power and the actual output power that is being sourced to the power output and load circuit within phantom block 48 on FIG. 1. The power output control signal is then coupled to the base of Q2, an NPN 2222 on FIG. 7b where it is combined with the input bias signal from the boosted dc buss HVA, to provide a scaled control signal to U10-3, the FB input to control the duty cycle period of the PWMB signal out of U11 to the buck converter modulator Q2G input on FIG. 3 thereby increasing or decreasing the rail voltage to the full wave bridge thereby controlling the output power to the PZT load.

Referring to FIG. 5, T2 has two secondary windings. The terminals of the top secondary 20, 21 are coupled to a resistor divider formed by R11 in series with R12. The VOH and VOL output terminals sample the scaled down voltage across the R11 and R12 resistor divider. The voltage across terminals 20 and 21 provide a measure of the volts per turn supported by T2 that is scaled by the R11 and R12 divider and that are provided by the second winding at terminals 17, 18.

Power Output Circuit and Load FIG. 5 and Analog Power Level Control Circuit FIG. 7a FIG. 5 shows that CT3, a 100:1 current sense transformer that measures the current in the path to a PZT load to the right of J3-2 and J3-1 terminals the PZT block. The CT3 secondary is terminated by scaling resistor R10 and provides a voltage across terminals CT3A and CT3B that is proportional to the current moving in the output path through the PZT load.

The bridge drive circuit 44 of FIG. 4a is responsive to a first and second pair of complementary resonant mode controller output signals coupled from respective first and second secondaries of transformer T1, a transformer means having isolated first and second secondaries for providing two pairs of isolated FET drive signals, to the four FET switches shown on FIG. 4a. The two pairs of isolated FET drive signals that comprise the frequency modulated drive signals FMDS are signals that originate out of IC U6-7 and U6-5 as complementary drive signals, as shown on FIG. 4b.

Transformer winding T2-20 and T2-21 provide a volts per turn measure of the output voltage to the PZT load on T2 winding T2-17 and T@-18. The T2-20, T2-21 voltage is terminated on R12 and output as the VOH and VOL output voltage signal to FIG. 7a for the output power measurement. The CT3 output current measurement signal OCMS and the output voltage measurement signal OVMS are coupled to FIG. 7a to provide two inputs to an AD633 Low Cost Four Quadrant Analog Multiplier. The analog product of the VOH output voltage measurement and the CT3 output current measurement are used to provide an instantaneous measurement by the multiplier function of U7 of the output power to be delivered to the PZT load 32 on FIG. 5. The U7 integrated circuit therefore provides a multiplier circuit for providing the product of the OCMS and the OVMS signals to obtain a signal representing the instantaneous power being dissipated in the PZT POZT. The output of the multiplier U7-5 is a signal representing the instantaneous power that is actually being dissipated in the PZT. The signal from U7-5, POZT is fed to the input of non-inverting unity gain amplifier U9A. U9A buffers and scales the signal and provides it to the inverting input of error amplifier U9B-6 as described above.

a multiplier circuit for providing the product of the OCMS and the OVMS signals to obtain a signal representing the instantaneous power being dissipated in the PZT POZT, a summing circuit for providing the difference between the output power required signal OPRS and the instantaneous power being dissipated in the PZT POZT and outputting the difference as an error signal, FET Q4 shown on FIG. 7a, grounds the non-inverting U9B-5 pin in response to a positive incoming RDY signal from U2-5, in the boost control circuit on FIG. 6. Grounding the signal to U9B-5 produces an over-ride command that is equivalent to turning the output power control to its lowest limit by grounding the input to the error amplifier U9B. A low on U9B-5 in FIG. 7a forces the output of U9B, U9B-7 to a lower level thereby reducing the current into the collector of Q2 on FIG. 7b. As Q2 is biased towards a non conductive state, the boosted dc voltage HVA from FIG. 3, raises the voltage to pin 3 of U10, the FB input, on FIG. 7b.

Phantom block 60 represents a frequency modulating drive circuit 60 that provides a frequency modulated drive signal FMDS shown within phantom ellipse 62. The frequency modulating drive circuit 60 has bridge drive circuit, represented by block 42, as shown on FIG. 4b, coupled to or connected to receive a swept sideband modulation signal SSMS 64. The SSMS signal is a composite of a nominal sinusoidal frequency signal modulated by at least a first frequency to provide the modulated drive signal FMDS.

Figure 8:
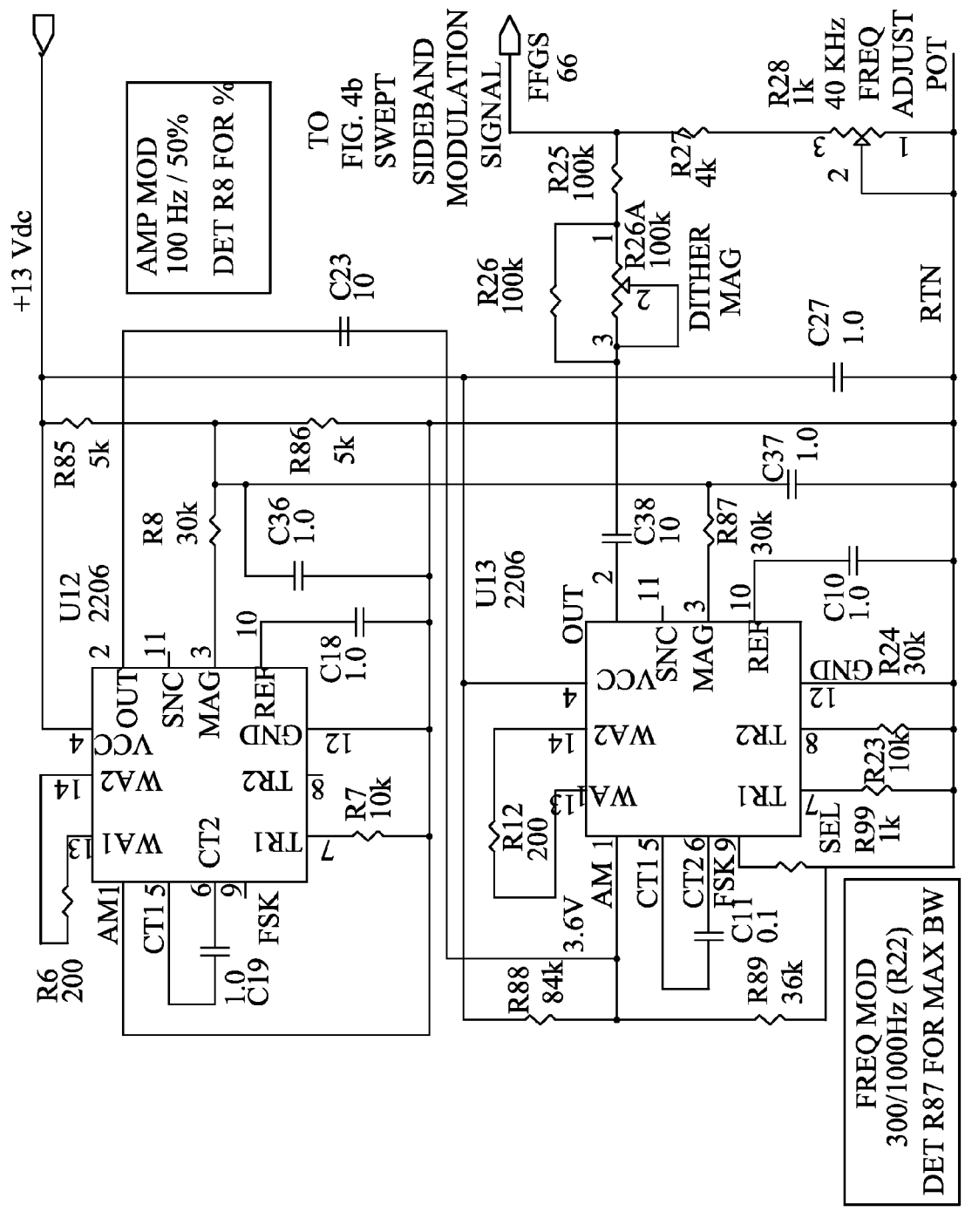
FIG. 8 is a schematic of the swept sideband modulation section.

Block 56 represents a swept sideband modulation circuit, the source of the SSMS 64 signal, that is explained more completely on FIG. 8. Referring now to FIG. 8, integrated circuit U13 is a 2206 function generator that serves as a first function generator in the circuit that provides a first function generator signal FFGS, a sine wave in the preferred embodiment of FIG. 8. The signal is coupled to pin U5-2, a TI UCC25600 device shown on FIG. 4b.

FIG. 8 also depicts a second function generator, IC U12, also a 2206 function generator that provides a second function generator signal SFGS at U12-2 to U13-1 so as to couple the output of the second function generator to the first function generator to modulate the first function generator signal FFGS to form the swept sideband modulation signal SSMS, as a composite of a first frequency modulated by a second frequency that is modulated by a third frequency, the third frequency being the frequency of the second function generator U12.

FIG. 4a shows the full wave bridge circuit that operates as a final driver stage of the Driver Circuit that drives T2 on FIG. 5. The output of T2 drives the PZT, a predominantly capacitive load. The full wave bridge circuit of FIG. 4 drives the primary winding of the output transformer T2 with a substantially square wave voltage. In the present embodiment, T2 has 38 turns in the primary winding and 38 turns in the secondary. There is distributed inductance in the circuit. The square wave voltage out of the secondary is therefore driving an inductor in series with a capacitive load provided by the PZT. The PZT load also has a resistive property depending on how it is loaded. The series combination of the distributed inductance, the PZT and the resistance of the PZT form a damped series resonant load. In operation the voltage across the PZT can rise to sine wave values exceeding 2000 volts peak to peak at about 40 Khz.

Swept Sideband 40 Khz Bridge Control

Figure 4B:
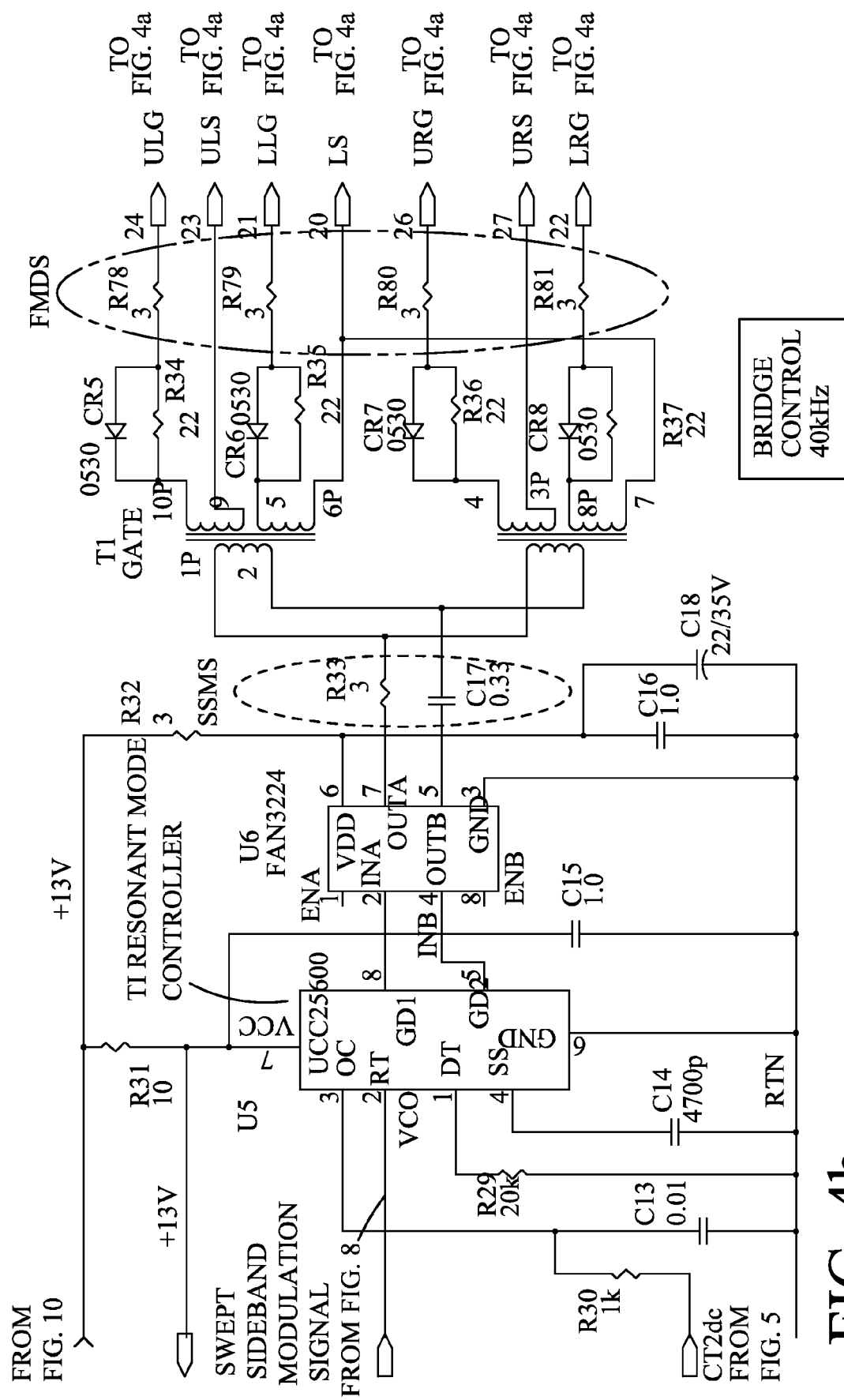
FIG. 4b is a schematic of the full-wave bridge drive circuit.

The bridge inputs at FIG. 4a are received from the T1 transformer at the right side of FIG. 4b is shown as a pair of transformers, each having a primary and an isolated and floating first and second secondary. The T1 transformer provides a pair of isolated complementary drive signals to the four FET switches that comprise the full wave bridge. The T1 transformer is therefore shown to be a first and second isolation drive transformer with each respective isolation drive transformer having a primary driven by the driver circuit first and second complementary drive signals.

At the left of FIG. 4b. we see U5, a UCC25600 voltage controlled oscillator, also described as a Texas Instrument resonant mode controller, that provides a drive signal to IC U6, a FAN3224 driver circuit. The U5 IC operates to frequency modulate the output drive to the 40 KHz bridge circuit. The TI data sheet for the UCC25600 has an internal oscillator with an operating range of from 40 KHz to 350 KHz and provides complementary switching outputs at pins 5 and 8 in response to a control voltage that modulates the frequency of the internal oscillator that operates at a nominal frequency set by a bias current sink from U5-2 on FIG. 4b to R27 and pot R28 on FIG. 8. In the present embodiment, the U5 IC operates at a predetermined nominal frequency PNF. The predetermined nominal frequency is frequency modulated by a first function generator signal FFGS to form the swept sideband modulation signal SSMS 64, a composite of a first frequency modulated by at least a second frequency such as the FFGS 66 signal from U13-2 shown on FIG. 8.

The resonant mode controller output swept sideband modulation signal SSMS 54 is provided at the output of U5-8. The output of U5-8 is coupled to the input of U6-8, a FAN3224 high speed low side driver IC by TI where the SSMS signal is buffered to be a complementary pair of resonant mode controller output signals of equal duration separated by a programmed dead time characterizing the frequency modulated by a second frequency SSMS to the bridge drive circuit.

The U5 resonant mode controller, or voltage controlled oscillator provides a complementary pair of resonant mode controller output signals of equal duration separated by a programmed dead time at the frequency of internal oscillator to the U6 FAN3224 driver IC. The driver responds to the square wave output signal from the voltage controlled oscillator U5 by providing a first complementary drive signal and a second complementary drive signal that is complementary to the first driver signal to the inputs of U6. Each drive signal is of equal duration and separated by the programmed dead time. Control of the drive to the full wave bridge circuit is therefore not by the means of pulse width modulating the duty cycle of the four FET switches that comprise the two switching legs of the full wave bridge circuit shown on FIG. 4a. It will be shown that the output power to the load via the full wave bridge circuit will be obtained by controlling the rail voltage, the buck output voltage, BOV to the bridge circuit of FIG. 4a to be within a range of from 30-330 Vdc.

FIG. 8 shows R28, the 40 KHz adjust pot that is adjusted to obtain a nominal 40 KHz switching drive frequency out of U5 shown on FIG. 4b. However the bias signal from R28 is further modulated by the swept side-band signal from U13, a first function generator, via a dither voltage from dither mag pot R26, also on FIG. 8. The dither magnitude signal is a 300 to 1000 Hz sine wave voltage from function generator U13 that is itself modulated by a second dither signal of 100 Hz from U12, a second function generator. The R26 dither mag pot controls the depth of modulation of the nominal 40 KHz frequency of the U5 IC on FIG. 4b.

U12 and U13 are 2206 type function generator Ics by EXAR that are programmed to output sine wave voltage outputs. The sine wave voltage output of the U13 function generator is also amplitude modulated. In the preferred embodiment, the U13 IC is configured to output a nominal 300 Hz signal to the input of the U5. The U5 output then outputs a 40 KHz drive signal that is nominally frequency modulated at 300 HZ, however the actual range of the modulation is dependent on the peak to peak voltage swing of the signal from U13. The peak to peak swing of the output voltage of U13 influences the frequency range that the U5 voltage controlled oscillator will actually traverse. Pot R26A is sized and adjusted to control the range of the voltage swing into U5 thereby controlling the range of the frequency swing of U5.

300 Hz and 100 Hz were chosen for the prototype system test and could be changed in the future. The magnitude of the first function generator signal at 300 Hz determines the positive and negative frequency excursion (bandwidth) around the 40 kHz. A developmental prototype is set to and running with a sweep from 38 to 42 kHz.

The modulation characteristic of the first function generator determines the frequency distribution. The resonant frequency of the PZT is selected to be approximately 40 kHz. The frequency spectrum of the current into the transducer has a broad band pass characteristic. The band of the spectrum is selected to resonate transducer within the band. The PZT has a band pass tolerance that permits the wide tolerance of transducer resonant frequencies.

The "spread spectrum" characteristic of the drive signal breaks up the tendency for vertical standing waves in the cleaning tank allowing for a more homogeneous cleaning action.

U12 is a second function generator that is adjusted to output a 100 Hz signal to U13-1. The signal into U13-1 amplitude modulates the sinusoidal output out of U13-2. The result out of U5 is an output that when monitored with a spectrum analyzer shows a spread of harmonics that begin at 38 KHz and extend continuously up to 42 KHz. The result is that the cleaner is improved in its ability to clean parts by eliminating standing waves in the cleaning solution.

Operation of the U5 voltage controlled oscillator VCO alone at 40 KHz does not produce a spread of side bands in the output drive signal. The side bands produced by the introduction of outputs of the first and second function generators are discrete. By amplitude modulating the output of the first function generator U13, with a 300 Hz signal, the circuit is sweeps the output of the VCO at a 100 Hz rate through a 300 Hz range. The result is a substantially uniform spread of side bands.

40 Khz Bridge Control

U12 is adjusted to output a 100 Hz signal to U13-1. The signal into U13-1 amplitude modulates the sinusoidal output out of U13-2. The result out of U5 is an output that when monitored with a spectrum analyzer shows a spread of harmonics that begin at 38 KHz and extend continuously up to 42 KHz. The result is that the cleaner is improved in its ability to clean parts.

The boost converter circuit 23 functions to aid in supporting the 374 Vdc bus to the buck regulator by increasing its duty cycle as the output of the full wave rectifier D1 drops to near zero with each half cycle of input cycle and then rises at a 120 Hz rate. The buck regulator draws power off of the 374 Vdc bus and down-converts the voltage to the controlled rail voltage to the full wave bridge shown on FIG. 4a. The Full Wave Bridge, shown on FIG. 4a operates in the frequency range of 35-45 KHz as it provides a balanced square wave drive to the primary winding of transformer T2 shown on FIG. 5. The bridge modulator uses the applied 300 V swing on its rails to provide a peak to peak swing of 600 volts at an output frequency of 35-45 KHz across the primary of T2 shown in FIG. 5.

Figure 9:
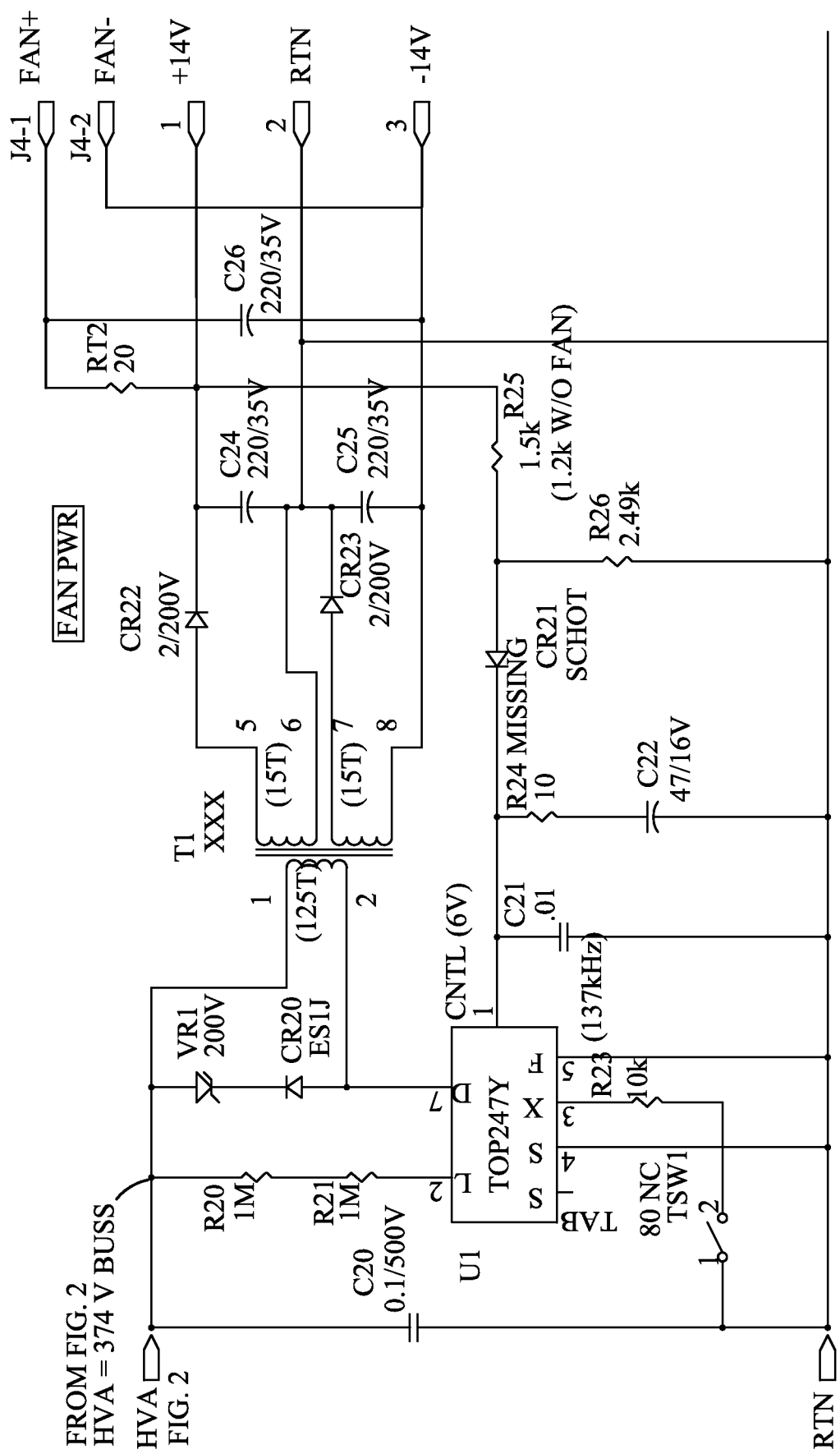
FIG. 9 is a schematic of the FAN POWER section.

FIG. 9 is a fan supply powered off the 374 Vdc bus. U1 is an Eco Smart OFF LINE SWITCHER IC from Power Integrations. This circuit provides drive voltages to a cooling fan.

Figure 10:
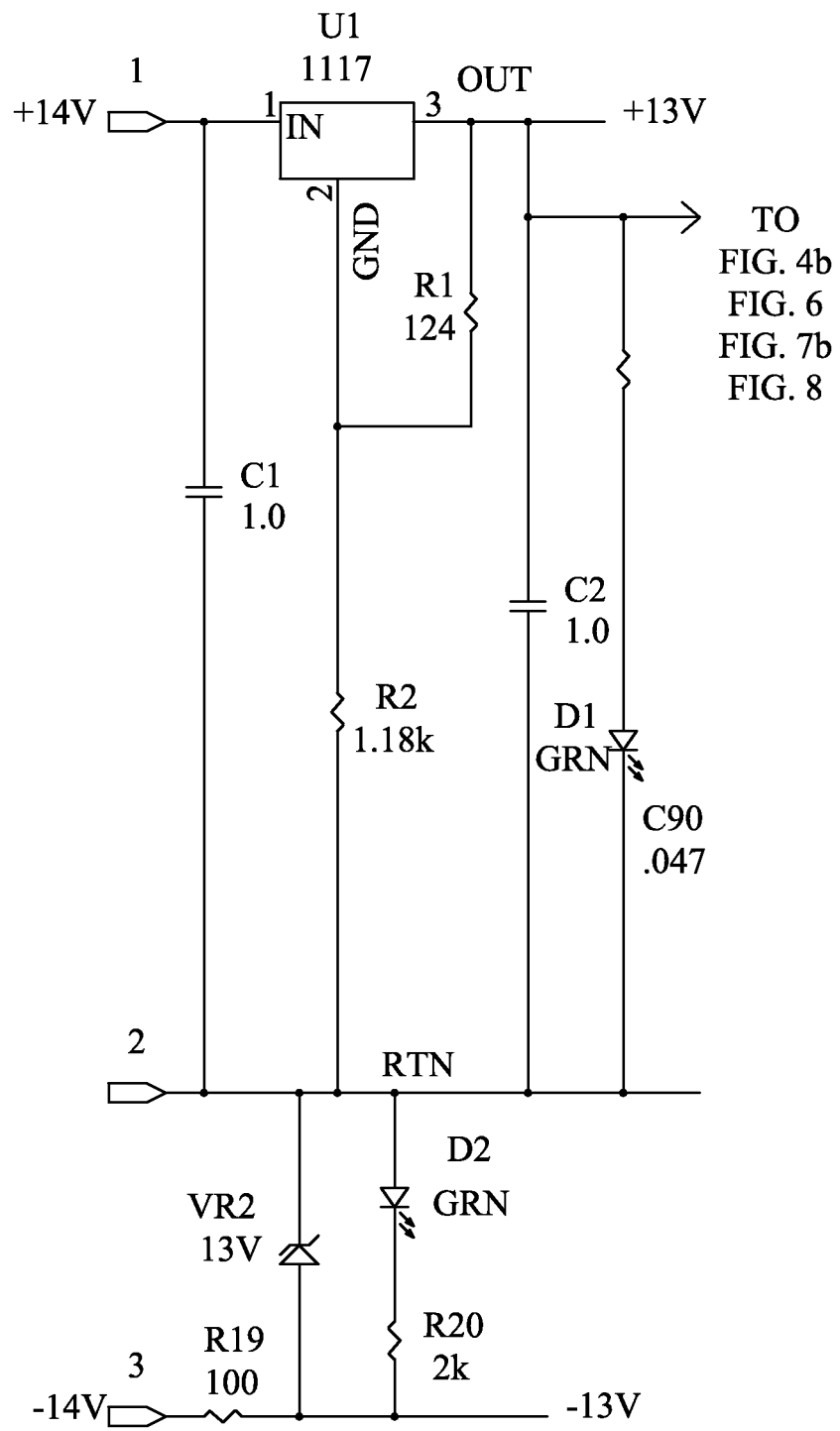
FIG. 10 is a schematic of the + and −13 Vdc linear regulator section.

FIG. 10 is a schematic of the +13 using a conventional three terminal adjustable linear regulator similar to the LM 117 and −13 bias supplies using a 13 V zener shunt regulator.

While certain specific relationships, materials and other parameters have been detailed in the above description of a preferred embodiment, those can be varied, where suitable, with similar results. Other applications and variations of the present invention will occur to those skilled in the art upon reading the present disclosure. Those variations are also intended to be included within the scope of this invention as defined in the appended claims.

What is claimed is:

1. A swept side band driver circuit comprising:

A full wave rectifier responsive to voltage from an ac mains source for providing a full wave rectified voltage (FWRV), a boost converter circuit coupled to the full wave rectified voltage (FWRV) for providing a boosted dc voltage (HVA) and improved power factor, a buck converter circuit coupled to receive the boosted dc voltage (HVA) for providing a buck output voltage (BOV), and being responsive to an output power control signal (OPCS) for adjusting the value of the buck output voltage (BOV), a frequency modulating drive circuit for providing a frequency modulated drive signal (FMDS), and a full wave bridge circuit responsive to the frequency modulated drive signal FMDS) and to the buck output voltage (BOV) for providing a buffered frequency modulated output drive signal (BFMDS), a power output and load circuit responsive to the buffered frequency modulated output drive signal (BFMDS) for providing a drive signal to a PZT load.

2. The swept sideband driver circuit of claim 1 wherein the power output and load circuit further comprises;

an output voltage measurement circuit that measures the voltage applied to thee PZT load and provides an output voltage measurement signal (OVMS) scaled proportional to the voltage applied to the PZT load (OVMS), an output current measurement circuit providing an output current measurement signal (OCMS) proportional to the current through the PZT load, and an output power required circuit for providing an output power required signal (OPRS) scaled to define the power level required at the PZT load, an output power control circuit coupled to the output power required signal (OPRS) and to the output voltage measurement signal (OVMS) and to the output current measurement signal (OCMS) for providing an output power product signal (OPPS) proportional to the output power delivered to the PZT load, the output power control circuit also having a summing circuit coupled to receive the output power required signal (OPRS) signal and the output power product signal (OPPS) to provide a difference signal between output power required signal (OPRS) signal and the output power product signal (OPPS) signal and for providing the output power control (OPCS) signal to the buck converter circuit to drive the buck output voltage (BOV) in a direction to drive output power to the PZT to the level commanded by the output power required signal (OPRS).

3. The swept sideband driver circuit of claim 2 wherein the output power required circuit for providing an output power required signal (OPRS) scaled to define the power level required at the PZT load, further comprises;

a variable resistor having a first terminal connected to a bias voltage source, a second terminal connected to a reference return level and a control terminal coupled to a manually positioned tap for sensing a manually selected proportional voltage scaled to represent the output power required signal (OPRS).

4. The swept sideband driver circuit of claim 1 wherein the boost converter circuit (23) further comprises:
a boost modulator (22) coupled to the full wave rectified voltage is controlled by
a boost control circuit, the boost control circuit is coupled to sample the full wave rectified voltage and the boosted dc voltage (HVA) output,
a current sense resistor connected in series with the return circuit from the boosted dc voltage, the return current through the current sense resistor provides a feedback signal to the boost control circuit that is compared to a current command signal within the boost control circuit for power factor correction.

5. The swept sideband driver circuit of claim 1 wherein the boost converter circuit (23) further comprises:
a boost modulator (22) coupled to the full wave rectified voltage is controlled by
a boost control circuit operating as a current mode controller with a fixed duty cycle.

6. The swept sideband driver circuit of claim 1 wherein the load current measurement transformer circuit further comprises:
a primary winding driven by the buffered frequency modulated output drive signal (BFMDS) from the full wave bridge,
a first secondary for impedance matching and for coupling an output voltage to the PZT load, and
a second secondary providing the isolated output voltage measurement signal (OVMS) proportional to the output voltage applied to the PZT load.

7. A swept side band driver circuit comprising:
A full wave rectifier responsive to voltage from an ac mains source for providing
a full wave rectified voltage (FWRV),
a boost converter circuit (23) coupled to the full wave rectified voltage (FWRV) for providing a boosted dc voltage (HVA), the boost converter circuit comprising:
a boost modulator circuit (22) coupled to be powered from the full wave rectified voltage (FWRV) and coupled to be driven by a boost pulse width modulated signal PWMA, the boost modulator circuit providing a boosted dc voltage (HVA) and a switch mode current sense voltage IS, and
a boost control circuit (24) coupled to sample the full wave rectified input dc voltage (FWRV), the switch mode current sense voltage IS for power factor correction and control, and the boosted dc voltage (HVA) for feedback to constantly adjust the duty cycle of the boost pulse width modulated signal PWMA, to maximize the power factor correction of the boost converter circuit and to hold the value of the boosted dc voltage (HVA) within a predetermined boosted dc voltage range,
a buck converter circuit (29) coupled to be powered from the boosted dc voltage (HVA), the buck converter circuit being responsive to an output power control signal (OPCS) for providing a buck output voltage (BOV), and
a full wave bridge circuit (44) responsive to a frequency modulated drive signal FMDS and to the buck output voltage (BOV) for providing a buffered frequency modulated output drive signal (BFMDS),
a power output and load circuit (48) responsive to and powered by the buffered frequency modulated output drive signal (BFMDS) for providing a drive signal to a PZT load.

8. The swept sideband driver circuit of claim 7 wherein the power output and load circuit further comprising;
a means for providing an output current measurement signal OCMS proportional to the current passing through the PZT load,
a means for providing An output voltage measurement signal OVMS proportional to the voltage applied to the PZT load,
an output power control circuit comprising:
a manually adjusted output power required circuit to provide an output power required signal (OPRS) scaled to define the power level required at the PZT load,
a multiplier circuit for providing the product of the OCMS and the OVMS signals to obtain a signal representing the instantaneous power being dissipated in the PZT (POZT),
a summing circuit for providing the difference between the output power required signal (OPRS) and the instantaneous power being dissipated in the PZT (POZT) and outputting the difference as an error signal,
an integrator circuit for scaling integrating, and buffering the error signal to provide the power control signal (OPCS) to the buck converter circuit (29) to control the value of the buck output voltage (BOV), to drive the error voltage to zero,
whereby the power delivered to the PZT will equal the power level required at the PZT load.

9. The swept sideband driver circuit of claim 7 wherein the output power required circuit for providing an output power required signal (OPRS) scaled to define the power level required at the PZT load, further comprises;
a variable resistor having a first terminal connected to a bias voltage source, a second terminal connected to a reference return level and a control terminal coupled to a manually positioned tap for sensing a manually selected proportional voltage scaled to represent the output power required signal (OPRS).

10. The swept sideband driver circuit of claim 7 wherein the power output and load circuit further comprising;
a load current measurement transformer having a primary winding in series with the PZT load, and an isolated secondary terminated in a current scaling resistor providing a signal voltage proportional to the current passing through the PZT load, and
an output transformer (52) having a primary winding driven by the buffered frequency modulated output drive signal (BFMDS) from the full wave bridge, and
a first secondary for impedance matching and for coupling an output voltage to the PZT load, and
a second secondary providing an isolated output voltage measurement signal (OVMS) proportional to the output voltage applied to the PZT load,
an output current measurement transformer for measuring the output current to the PZT load and for providing an output current measurement signal (OCMS),
an output power required function for providing an output power required signal (OPRS) characterizing the power level required at the PZT load,
an output power control function coupled to the output power required signal (OPRS), the isolated output voltage measurement signal (OVMS), to the output current measurement signal (OCMS) for providing an output power product signal (OPPS), scaled to represent the output power being delivered to the PZT load, a summing circuit for comparing the output power required signal (OPRS) signal to the output power product signal (OPPS) signal and for providing the output power control (OPCS) signal to the buck converter circuit to drive the output power to the PZT to the level commanded by the output power required signal (OPRS).

11. A swept side band driver circuit comprising:

A full wave rectifier responsive to voltage from an ac mains source for providing a full wave rectified voltage (FWRV), a boost converter circuit (23) coupled to the full wave rectified voltage (FWRV) for providing a boosted dc voltage (HVA), a buck converter circuit (29) coupled to receive the boosted dc voltage (HVA) for providing a buck output voltage (BOV), the buck converter circuit being responsive to an output power control signal (OPCS) for adjusting the value of the buck output voltage (BOV), a frequency modulating drive circuit (60) for providing a frequency modulated drive signal (FMDS), the frequency modulating drive circuit having a bridge drive circuit (42) coupled to receive a swept sideband modulation signal (SSMS) characterized as being a composite of a nominal sinusoidal frequency modulated by at least a first frequency to provide the modulated drive signal (FMDS), and a swept sideband modulation circuit (56) having at least a first function generator providing a first function generator signal (FFGS), and a resonant mode controller, having an internal oscillator operating at a predetermined nominal frequency (PNF), the predetermined nominal frequency being frequency modulated by the first function generator signal (FFGS) to form the swept sideband modulation signal (SSMS), a composite of a first frequency modulated by a second frequency the resonant mode controller output swept sideband modulation signal (SSMS) being provided by means of a complementary pair of resonant mode controller output signals of equal duration separated by a programmed dead time characterizing the frequency modulated by a second frequency (SSMS) to the bridge drive circuit, the bridge drive circuit (42) being responsive to the complementary pair of resonant mode controller output signal coupled to a transformer (T1) means having isolated first and second secondaries for providing two pairs of isolated FET drive signals that comprise the frequency modulated drive signals (FMDS), a full wave bridge circuit (44) responsive to a frequency modulated drive signal FMDS) and to the buck output voltage (BOV) for providing a buffered frequency modulated output drive signal (BFMDS), a power output and load circuit (48) responsive to and powered by the buffered frequency modulated output drive signal (BFMDS) for providing a drive signal to a PZT load.

12. The swept sideband driver circuit of claim 11 wherein the swept sideband modulation circuit (56) having at least a first function generator providing a first function generator signal (FFGS), and a resonant mode controller, having an internal oscillator operating at a predetermined nominal frequency (PNF), the predetermined nominal frequency being frequency modulated by the first function generator signal (FFGS) to form the swept sideband modulation signal (SSMS), a composite of a first frequency modulated by a second frequency further comprising;

a second function generator providing a second function generator signal (SFGS) coupled to the first function generator to modulate the first function generator signal (FFGS)) to form the swept sideband modulation signal (SSMS), a composite of a first frequency modulated by a second frequency that is modulated by a third frequency.

13. The swept sideband driver circuit of claim 11 wherein the power output and load circuit further comprising;

an output transformer (52) having a primary winding driven by the buffered frequency modulated output drive signal (BFMDS) from the full wave bridge (44), and a first secondary for coupling output voltage to the PZT load.

14. The swept sideband driver circuit of claim 11 wherein the full wave bridge circuit (44) is further characterized as being coupled to the frequency modulated drive signal FMDS) and to the buck output voltage (BOV) to provide a buffered frequency modulated output drive signal (BFMDS), and wherein the bridge drive circuit (42) outputs a complementary pair of resonant mode controller output signals of equal duration separated by a programmed dead time characterizing the frequency modulated driver signal (FMDS).

15. The swept sideband driver circuit of claim 11 wherein the power output and load circuit further comprising;

an output transformer (52) having a primary winding driven by the buffered frequency modulated output drive signal (BFMDS) from the full wave bridge, and a first secondary for impedance matching and for coupling an output voltage to the PZT load, and a second secondary providing an isolated output voltage measurement signal (OVMS) proportional to the output voltage applied to the PZT load, an output current measurement transformer for measuring the output current to the PZT load and for providing an output current measurement signal (OCMS), an output power required function for providing an output power required signal (OPRS) characterizing the power level required at the PZT load, an output power control function coupled to the output power required signal (OPRS), the isolated output voltage measurement signal (OVMS), to the output current measurement signal (OCMS) for providing an output power product signal (OPPS), scaled to represent the output power being delivered to the PZT load, a summing circuit for comparing the output power required signal (OPRS) signal to the output power product signal (OPPS) signal and for providing the output power control (OPCS) signal to the buck converter circuit to drive the output power to the PZT to the level commanded by the output power required signal (OPRS).

16. The swept sideband driver circuit of claim 11 wherein the boost converter circuit coupled to the full wave rectified voltage (FWRV) for providing a boosted dc voltage (HVA), further comprises;

a boost modulator circuit (22) coupled to the full wave rectified input dc voltage (FWRV) and to a first pulse width modulated signal (PWMA), and a boost control circuit coupled to sample the full wave rectified voltage (FWRV), and the boosted dc voltage (HVA) and to constantly adjust the duty cycle of the first pulse width modulated signal (PWMA), to maximize the power factor correction of the boost converter circuit, a current sense resistor connected in series with the return circuit from the boosted dc voltage, the return current through the current sense resistor provides a current mode control feedback signal that is compared to a current command signal within the boost control circuit for power factor control.

\* \* \* \* \*